(12) United States Patent
Haun et al.

(10) Patent No.: US 7,978,463 B1
(45) Date of Patent: Jul. 12, 2011

(54) TRANSPORTABLE WEATHERPROOF BATTERY POWER SUPPLY AND STORAGE FOR ELECTRONIC EQUIPMENT

(75) Inventors: Darrell N. Haun, Sugar Land, TX (US); Donald N. Haun, Stafford, TX (US); Victor Gingles, Sugar Land, TX (US)

(73) Assignee: Solarcraft, Inc., Stafford, TX (US)

( * ) Notice: Subject to any disclaimer, the term of this patent is extended or adjusted under 35 U.S.C. 154(b) by 0 days.

(21) Appl. No.: 12/884,450

(22) Filed: Sep. 17, 2010

(51) Int. Cl.
*H05K 5/00* (2006.01)
*H05K 7/00* (2006.01)
*H02J 7/02* (2006.01)
*A47B 81/00* (2006.01)
*A47B 97/00* (2006.01)

(52) U.S. Cl. ............. 361/679.01; 361/679.02; 361/518; 361/536; 361/724; 320/107; 320/111; 312/223.2; 312/223.3

(58) Field of Classification Search .................. 361/518, 361/536, 679.01, 679.02, 679.55, 724, 727; 320/107, 111; 312/223.2, 223.3
See application file for complete search history.

(56) References Cited

U.S. PATENT DOCUMENTS

| 5,335,730 | A | 8/1994 | Cotham, III |
| 5,361,626 | A | 11/1994 | Colligan et al. |
| 5,757,283 | A | 5/1998 | Janoska |
| 2003/0192675 | A1 * | 10/2003 | Cosley et al. ............ 165/104.32 |
| 2009/0224639 | A1 * | 9/2009 | Sosin ......................... 312/223.1 |

* cited by examiner

*Primary Examiner* — Jayprakash N Gandhi
*Assistant Examiner* — Anthony M Haughton
(74) *Attorney, Agent, or Firm* — Buskop Law Group, PC; Wendy Buskop

(57) ABSTRACT

One or more embodiments of transportable weatherproof battery power supply and storage for electronic equipment are provided. The transportable weatherproof enclosure can include a base, an enclosure removably engaged to a base plate; a first door pivotably connected to the first wall, a second door pivotably connected to the second wall, and a first battery pack disposed within the enclosure.

20 Claims, 7 Drawing Sheets

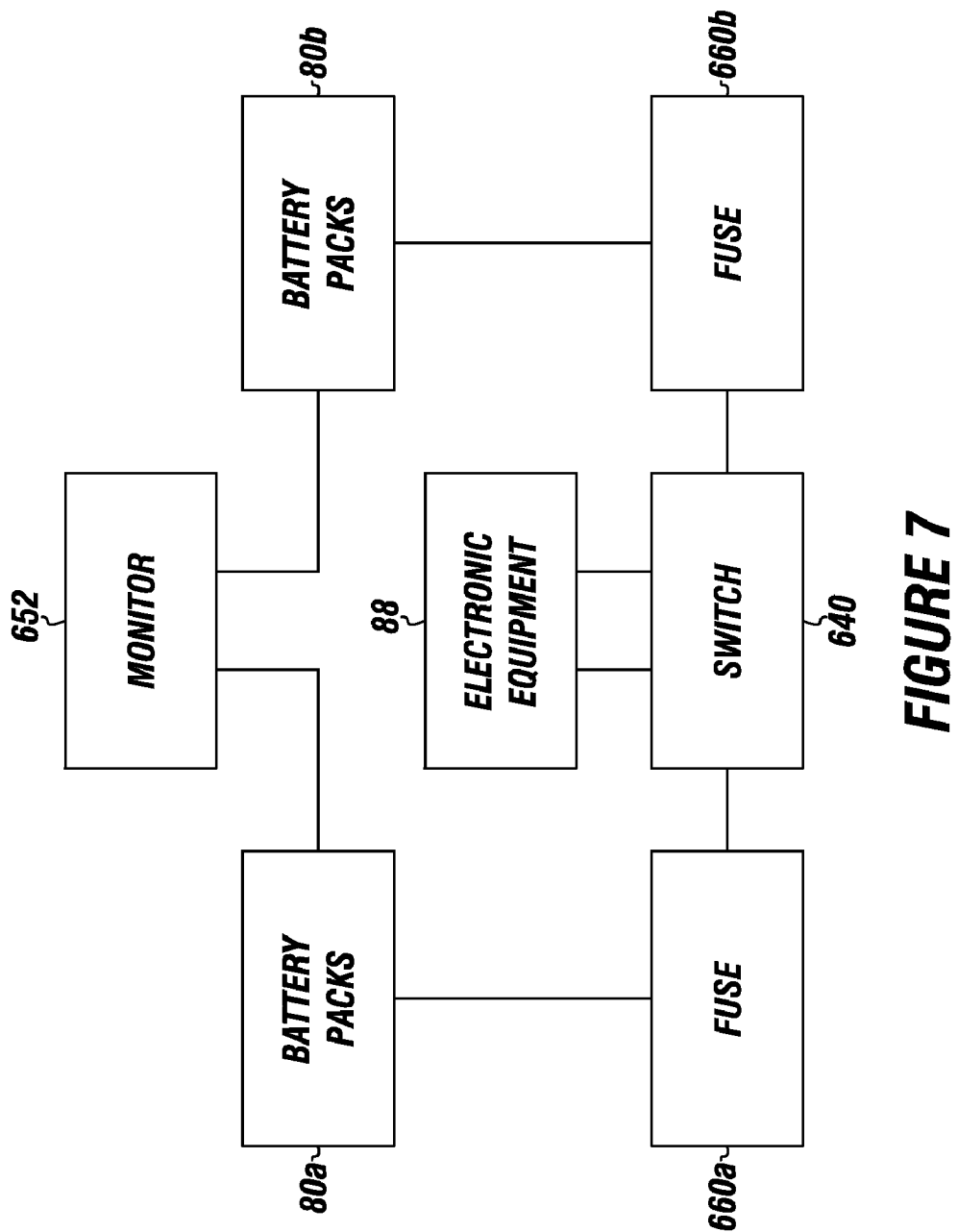

TRANSPORTABLE WEATHERPROOF BATTERY POWER SUPPLY AND STORAGE FOR ELECTRONIC EQUIPMENT

FIELD

The present embodiments generally relate to a transportable weatherproof battery power supply and storage for electronic equipment.

BACKGROUND

A need exists for a transportable weatherproof battery power supply and storage for electronic equipment in a single enclosure, allowing final assembly of batteries at a factory as opposed to a final destination.

The removal of a stackable battery unit in a battery stack is difficult because the stackable battery unit is often large, heavy, and difficult to remove through access doors of a standard enclosure without special equipment. Accordingly, a need exists for weatherproof housing for electronic equipment that can be moved away from the batteries giving complete access to the entire battery stack for replacement.

The present embodiments meet these needs.

BRIEF DESCRIPTION OF THE DRAWINGS

The detailed description will be better understood in conjunction with the accompanying drawings as follows:

FIG. 7 depicts an illustrative transportable weatherproof battery power supply and storage for electronic equipment with electronic equipment in communication with one or more of the battery packs.

Figure 1:
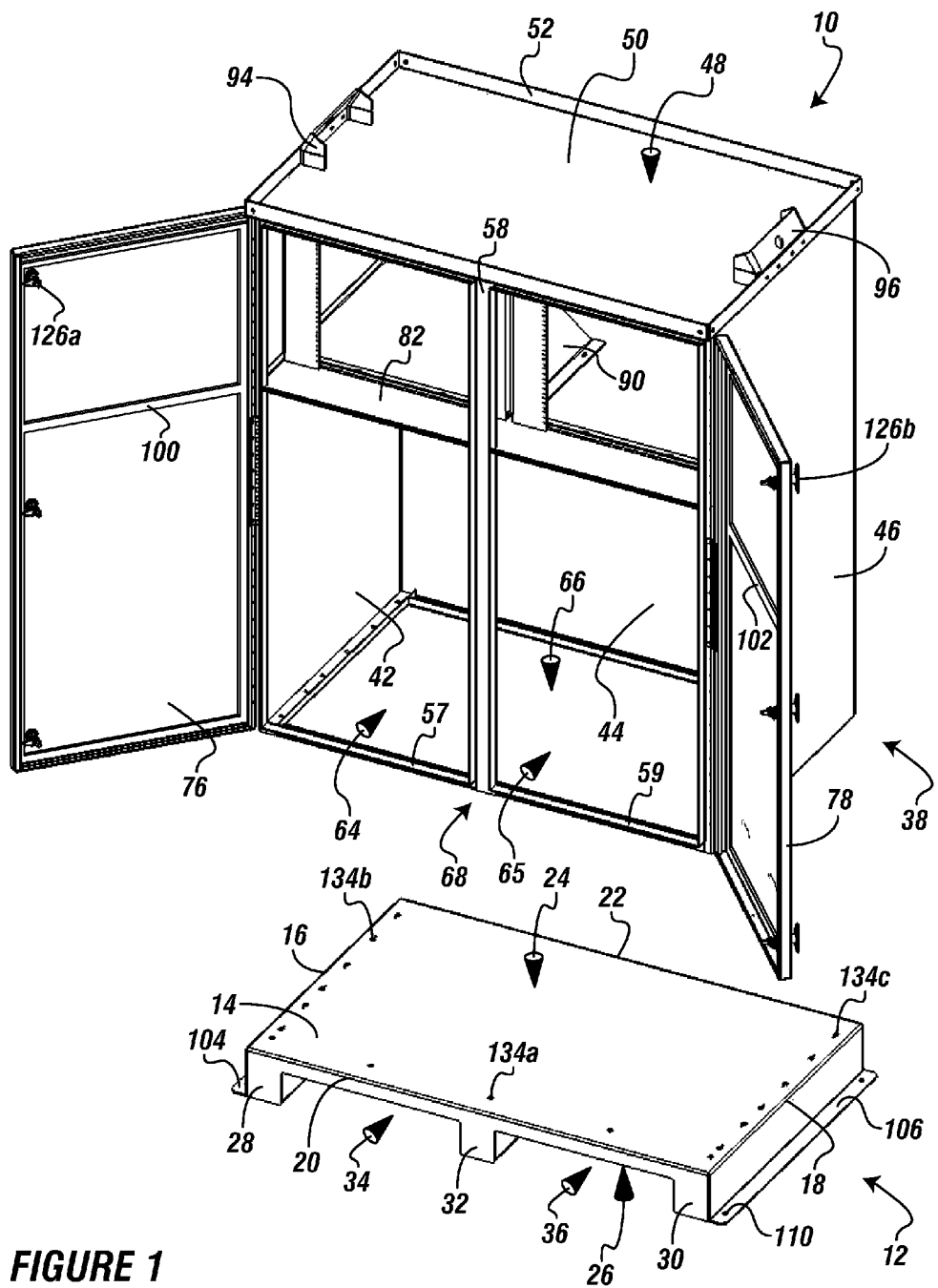
FIG. 1 depicts an isometric view of an illustrative transportable weatherproof battery power supply and storage for electronic equipment with an enclosure separated from a base.

The present embodiments are detailed below with reference to the listed Figures.

DETAILED DESCRIPTION OF THE EMBODIMENTS

The embodiments generally relate to a transportable weatherproof battery power supply and storage for electronic equipment.

An illustrative transportable weatherproof battery power supply and storage for electronic equipment can include a base. The base can be made from a metal, a polymer, a composite, fiberglass, sheet metal, or combinations thereof. The base can include a base plate. The base can be configured to support one or more battery pack.

An illustrative base plate can have a top surface, a bottom surface, a first end, a front end, a second end, and a back end. The base plate can be configure to support from about one pound to about twenty thousand pounds. For example, the base plate can support 10 pounds, 20 pounds, 100 pounds, 1,000 pounds, 10,000 pounds, 20,000 pounds. In one or more embodiments, the base plate can support up to 100,000 pounds.

The base can also include a first support leg. The first support leg can be connected to the bottom surface of the base plate. The first support leg can extend along the first end of the base plate.

The base can also include a second support leg. The second support leg can be connected to the bottom surface of the base plate. The second support leg can extend along the second end of the base plate.

The first support leg can include a first support flange. The first support flange can extend perpendicular to the first wall. The second support leg can include a second support flange that extends perpendicular to the second wall.

The first support flange can have one or more first wall attachment holes for engaging a surface. The second support flange can have one or more second wall attachment holes for engaging the surface. For example, a plurality of first wall attachment holes can be disposed through a first wall flange and a plurality of second wall attachment holes can be disposed through the second wall flange. The first wall attachment holes and the second hole attachment holes can be configured to aligned with holes formed into the base.

In one or more embodiments, the base can also include a third support leg. The third support leg can be connected to the base plate bottom surface. The third support leg can be disposed between the first support leg and the second support leg. The third support leg can extend parallel to the first support leg.

The base can also include one or more channel members. For example, one or more channel members can be connected to the bottom surface of the base plate between the base plate and each of the support legs. In one or more embodiments, the channel member can extend from the first wall to the second wall.

A first prong receiving channel can be disposed between the first support leg and the third support leg. The first prong receiving channel can be configured to receive a portion of a fork lift or other lifting device such as a pallet lift.

A second prong receiving channel can be disposed between the second support leg and the third support leg. The second prong receiving channel can be configured to receive another portion of a fork lift or other lifting device. For example, the first prong receiving channel can receive a first prong of a fork lift and the second prong receiving channel can concurrently receive a second prong of the fork lift.

The illustrative transportable weatherproof battery supply and storage for electronic equipment can further include an enclosure. The enclosure can be removably engaged to the base plate.

The enclosure can include a first wall, a back wall, a second wall, an interior, a hole, and a top. For example, the back wall can be connected to the first wall and the second wall, and the first wall can be parallel to the second wall.

The top can be disposed on the first wall, the second wall, and the back wall. As such, the back wall, the second wall, and the top can form an enclosure interior. The top can include a top plate. The top plate can have a top flange. The top flange can extend from the top plate and be disposed about a perimeter of the top plate. The top flange can include one or more top flange through hole.

At least one pair of lifting eyes can be disposed on the top plate. The pair of lifting eyes can include a first lifting eye connected to the top flange and centered over the first wall and a second lifting eye connected to the top flange and centered over the second wall. The first lifting eye can be aligned with the second lifting eye. The at least one pair of lifting eyes can be configured to allow lifting of the enclosure by a crane. Each lifting eye can be connected to at least one lifting eye gusset.

The enclosure can also include a vertical member connected to at least a portion of the top plate. The front vertical member can be connected to a bottom member. The bottom member can also be connected to the first wall and the second wall. For example, the bottom member can include to segments and a first segment can be connected to the front vertical member and the first wall, and a second segment can be connected to the front vertical member and the second wall.

An opening can be disposed between the first wall and the second wall and between the back wall and the bottom member. The opening can be configured to pass over a plurality of battery packs disposed on the base plate.

A first wall flange can be connected to the first wall, and a second wall flange can be connected to the second wall.

A first vertical member flange can be connected to a first portion of the front vertical member, and a second vertical member flange can be connected to a second portion of the front vertical member.

A first door and a second door can be pivotably connected to the enclosure. For example, the first door can be pivotably connected to the first wall and configured to engage the front vertical member, and the second door can be pivotably connected to the second wall and configured to engage the front vertical member.

One or more locking devices can be disposed on each door. Each locking device can be can be configured to engage the front vertical member, the first vertical member flange, the second vertical member flange, or combinations thereof.

The first door can include a first door flange. The first door flange can be configured to engage the first vertical member flange. In addition, the second door can include a second door flange configured to engage the second vertical member flange.

A first door gasket can be disposed about the first door flange, and a second door gasket can be disposed about the second door flange. As such, the first door gasket can be configured to sealably engage the first opening flange, and wherein the second door gasket can be configured to sealably engage the second opening flange.

In one or more embodiments, a first opening flange gasket can be disposed about the first vertical member flange and a second opening flange gasket can be disposed about the second vertical member flange. The first opening flange gasket can be configured to sealably engage the first door, and the second opening flange gasket can be configured to sealably engage the second door.

In one or more embodiments, a bulkhead can be connected to the first wall, the second wall, the back wall, and the front vertical member. Accordingly, the bulkhead can form a first enclosure portion between the bulkhead and the top and a second enclosure portion between the bulkhead and the first wall flange, the second wall flange, the bottom member flange, the back wall flange, or combinations thereof.

As such, the first enclosure portion can be configured to receive and support electronic equipment, and the second enclosure portion can be configured to receive and support one or more battery packs.

In one or more embodiments, a bulkhead support member, such as one or more a gussets, can be connected to the front vertical member, the top plate, the bulkhead, or combinations thereof. For example, the bulkhead support member can be disposed within the first enclosure portion and connected to a portion of the bulkhead and the top plate.

The first enclosure portion can also include one or more rack rails. The rack rails can be connected to the bulkhead, the top, or walls, the front vertical member, or combinations thereof. The rack rails can be used to mount electronic equipment.

In one or more embodiments, one or more vents can be formed into the enclosure. For example, one or more vents can be disposed through: the first door, the second door, the back wall, or combinations thereof.

In one or more embodiment, an access door can be disposed within the back wall. The access door can be used to place electronic equipment into and remove electronic equipment from the first enclosure portion. The electronic equipment can include a gas chromatograph, a flow meter, a recharging terminal for hand held electronic devices, or combinations thereof.

In one or more embodiments, one or more battery packs can be fastened to the base plate. In one or more embodiments, the battery packs can provide a voltage from about 1 volt to about 200 volts.

The electronic equipment can be in communication with one or more of the battery packs.

A switch can be disposed between the electronic equipment and the battery packs. The switch can be used to control the flow of electricity from one or more of the battery packs to the electronic equipment.

A monitor can be connected to the battery packs. The monitor can be configured to monitor and display information about one or more of the battery packs.

In one or more embodiments, a fuse can be in electrical communication with the electronic equipment and one or more battery pack.

Turning now to the Figures, FIG. 1 depicts an isometric view of an illustrative transportable weatherproof enclosure for electronic equipment and telecom batteries with an enclosure separated from a base. The transportable weatherproof enclosure for electronic equipment and telecom batteries 10 can include the base 12, the enclosure 38, a first door 76, and a second door 78.

The base 12 can include a base plate 14, a first support leg 28, a second support leg 30, a third support leg 32, a first prong receiving channel 34, and a second prong receiving channel 36.

The base plate 14 can include a first end 16, a second end 18, a front end 20, a back end 22, a top surface 24, and a bottom surface 26. The first end 16 can be parallel to the second end 18. The front end 20 can be parallel to the back end 22. The top surface 24 can have a plurality of base plate fastener holes 134a, 134b, 134c.

The first support leg 28, the second support leg 30, and the third support leg 32 can be connected to the bottom surface 26.

The first support leg 28 can have a first support flange 104. The first support flange 104 can be connected to the first support leg 28 or formed into the first support leg 28. For example, the first support leg 28 can be formed from bending sheet metal and the first support flange 104 can be bent into the first support leg. In another example, the first support leg 28 can be welded to the first support flange 104. In one or more embodiments, the first support flange 104 can have one or more first attachment holes not shown in FIG. 1, but shown below in FIGS. 4 and 5.

The second support leg 30 can include a second support flange 106. The second support flange 106 can be formed from the second support leg 30 or connected to the second support leg 30. The second support flange 106 can have one or more second attachment holes 110 formed into it.

The enclosure 38 can include a first wall 42, a back wall 44, a second wall 46, a top 48, a bottom member 68, a front vertical member 58, and a bulkhead 82.

An enclosure interior can be formed between an inner portion of the first wall 42 and the second wall 46. The enclosure interior can be capped by a top plate 50. A bottom opening 66 can be formed within the enclosure interior.

The first wall 42 can have any size and shape and can be positioned substantially perpendicular to the back wall 44 and parallel to the second wall 46. In one or more embodiments, the first wall 42, the back wall 44, and the second wall 46 can be formed from a single piece of sheet metal. In another embodiment, the first wall 42, the back wall 44, and the second wall 46 can be made from individual sheets and bolted or otherwise mechanically fastened to one another.

The top 48 can include a top plate 50 and a top flange 52. The top plate 50 can be configured to secure to the first wall 42, the second wall 46, and the back wall 44. For example, the top 48 can be welded, bolted or otherwise connected to the first wall 42, the second wall 46, and the back wall 44. The top plate 50 and the top flange 52 can be formed from one or more pieces of material. For example, the top plate 50 and top flange 52 can be formed from a single piece of sheet meta A first lifting eye 94 can be connected to the top flange 52. For example, the first lifting eye can be welded to the top flange and centered about the center of the first wall 42. A second lifting eye 96 can also be connected to the top flange 52. For example, the second lifting eye 96 can be connected to the top flange 52 and centered about the second wall 46.

The front vertical member 58 can be secured to the top plate 50 opposite the back wall 44. A first opening 64 can be formed between the front vertical member 58 and the first wall 42. A second opening 65 can be formed between the front vertical member 58 and the second wall 46.

The bottom member 68 can be connected to the first wall 42, the front vertical member 58, and the second wall 46. In one or more embodiments, the bottom member can include one or more segments. For example, the bottom member 68 can include a first segment 57 and a second segment 59. The first segment 57 can connect to the first wall 42 and the front vertical member 58, and the second segment 59 can connect to the front vertical member 58 and the second wall 46.

The bulkhead 82 can be connected to an interior portion of the first wall 42, the second wall 46, the top plate 50, and the front vertical member 58. The bulkhead 82 can be formed by one or more pieces of material. For example, the bulkhead can be formed from a single piece of sheet metal.

A bulkhead support member 90 can be used to support the bulkhead 82. The bulkhead support member 90 can be a gusset or similar device. The bulkhead support member 90 can be connected to the bulkhead 82 and other portions of the enclosure interior.

The first door 76 can be hinged to the first wall 42. The first door 76 can have one or more first door gaskets 100 disposed on an interior portion thereof. The first door 76 can be configured to engage the front vertical member 58 to close off the first opening 64. The first door gasket 100 can seal against a portion of the front vertical member 58 and the bulkhead 82 when the first door 76 is engaged with the front vertical member 58.

The second door 78 can be hinged to the second wall 46. The second door 78 can engage the front vertical member 58 and close off the second opening 65. In addition, the second door 78 can have a second door gasket 102, which can seal against a portion of the front vertical member 58 and the bulkhead 82 when the second door 78 is engaged with the front vertical member 58.

Each door 76 and 78 can have one or more locking device 126a and 126b respectively.

Figure 2:
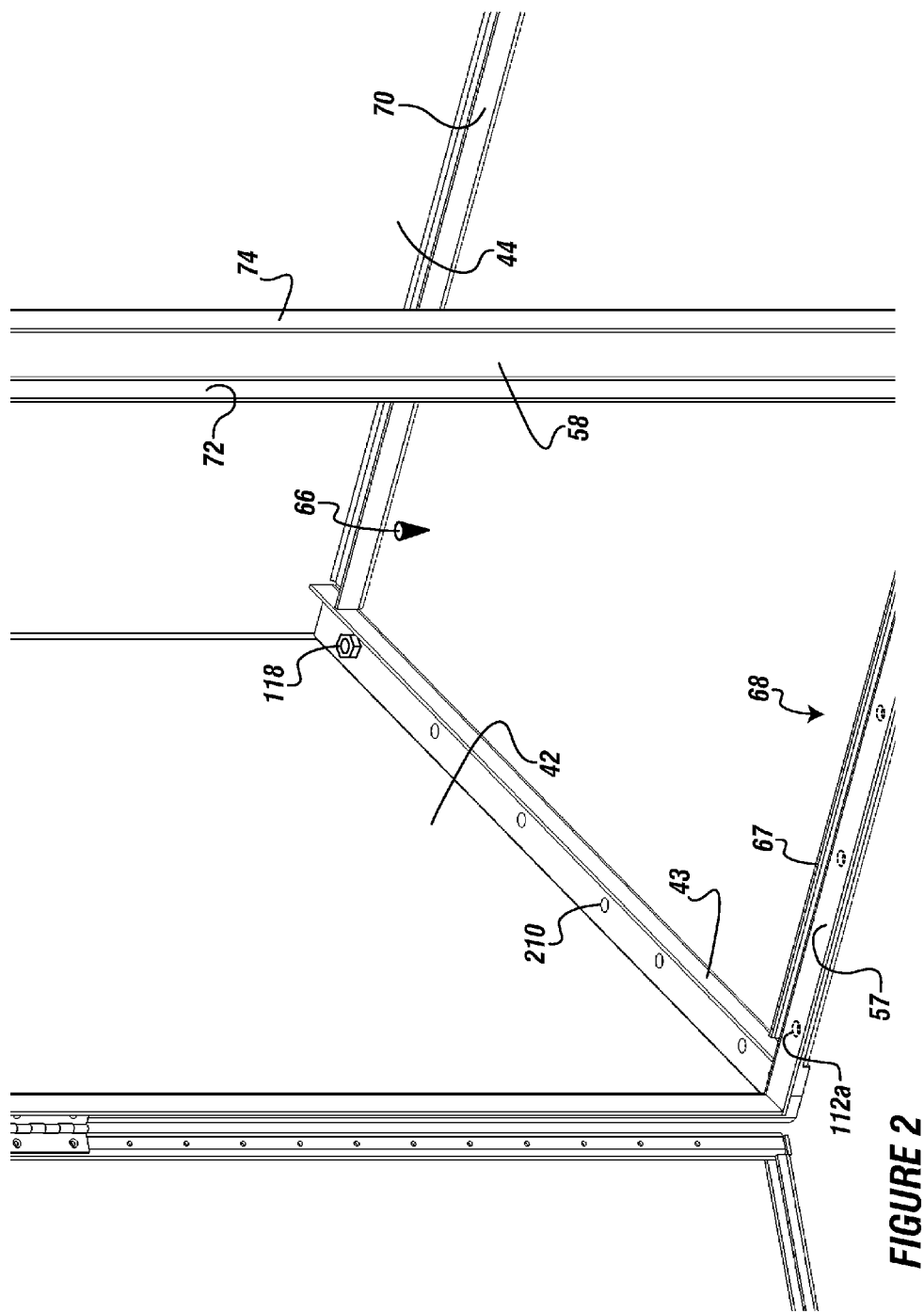
FIG. 2 depicts a detailed view of the first wall, the bottom member, and the back wall of FIG. 1.

FIG. 2 depicts a detailed view of the first wall, the bottom member, and the back wall of FIG. 1.

The first wall 42 can have a first wall flange 43 disposed on an inner portion thereof. The first wall flange 43 can be connected to or formed into the first wall 42. The first wall flange 43 can have a plurality of first wall attachment holes 210. Each of the first wall attachment holes 210 can be configured to receive a fastener 118.

The back wall 44 can have a back wall flange 70 disposed thereon. The back wall flange 70 can be connected to or formed into the back wall 44.

The first segment 57 of the bottom member 68 can have a bottom member flange 67 disposed thereon. The bottom member flange 67 can be connected to or formed into the first segment 57. The first segment 57 can have one or more front attachment holes 112a formed there through.

The front vertical member 58 can have a first vertical member flange 72 and a second vertical member flange 74 disposed thereon. The first vertical member flange 72 and the second vertical member flange 74 can be formed into or connected to the front vertical member 58.

The bottom opening 66 can be formed adjacent to the first wall flange 43, the back wall flange 70, and the bottom member flange 67.

Figure 3:
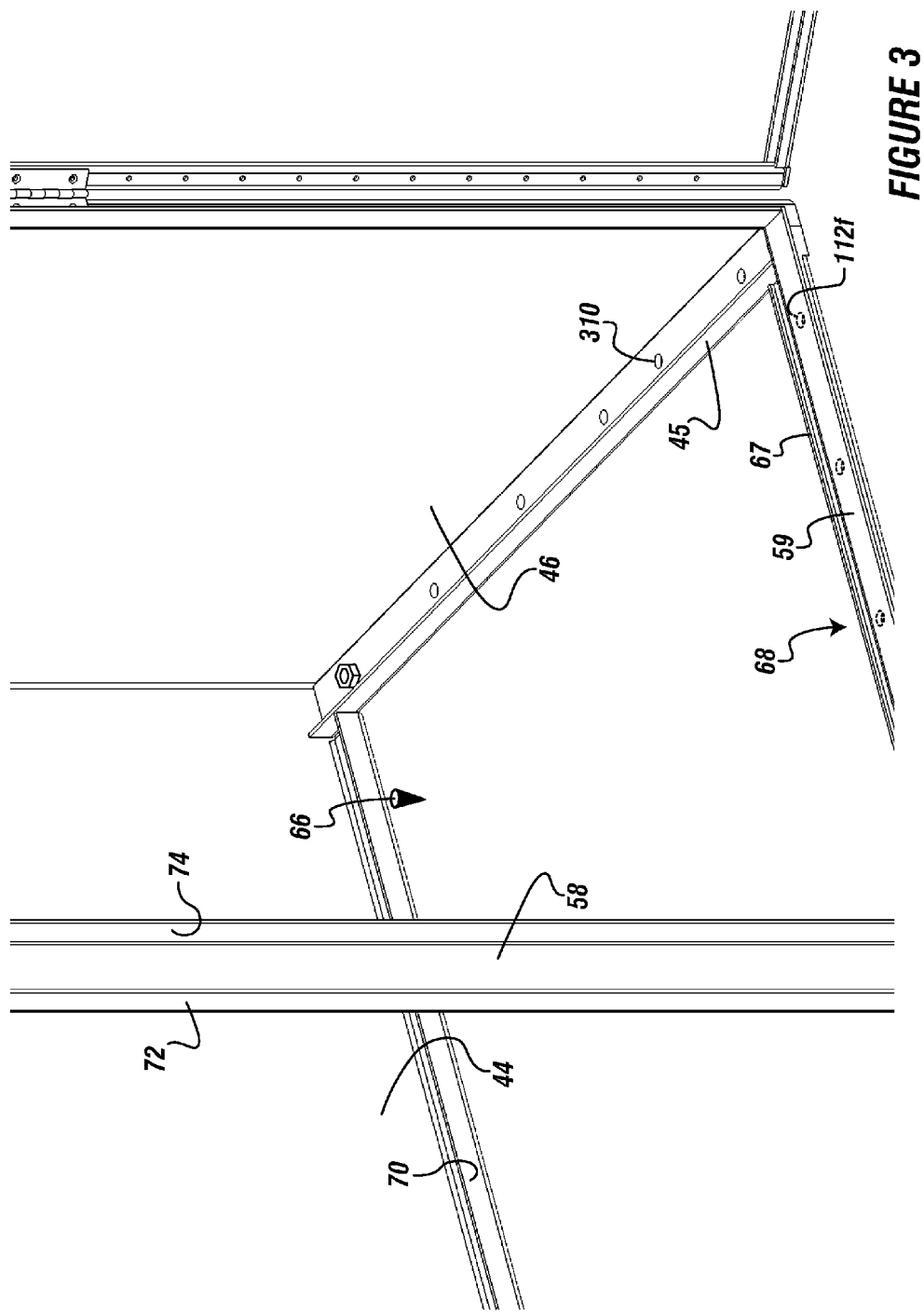
FIG. 3 depicts a detailed view of the second wall, the bottom member, and the back wall of FIG. 1.

FIG. 3 depicts a detailed view of the second wall, the bottom member, and the back wall of FIG. 1.

The second wall 46 can have a second wall flange 45 disposed thereon. The second wall flange 45 can be connected to or formed into the second wall 46. The second wall flange 45 can have a plurality of second wall attachment hole 310 formed there through. The second wall 46 can be adjacent the back wall 44. The back wall flange 70 can be disposed adjacent to the second wall flange 45.

The second segment 59 of the bottom member 68 can be adjacent the second wall 46. The second segment 59 can have one or more front attachment holes 112f formed therein. The second segment 59 can also have the bottom member flange 67 formed thereon.

The bottom opening 66 can be adjacent to the bottom member flange 67, the second wall flange 45, and the back wall flange 70.

The front vertical member 58 is shown with the first vertical member flange 72 and a second vertical member flange 74 disposed thereon.

Figure 4:
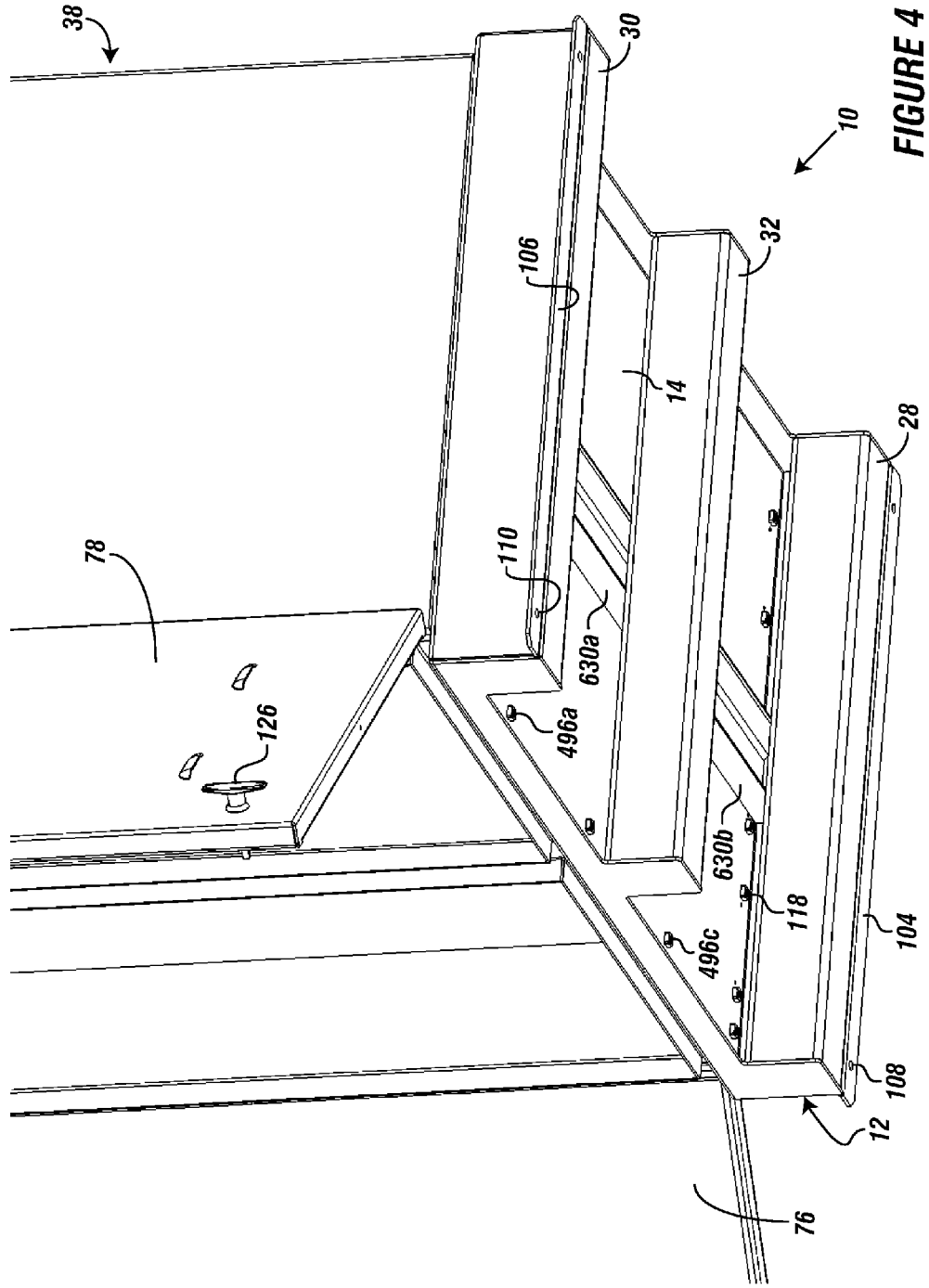
FIG. 4 depicts a detailed view of the base of FIG. 1.

FIG. 4 depicts a detailed view of the base of the transportable weatherproof enclosure for electronic equipment and telecom batteries 10 of FIG. 1.

The second door 78 and the first door 76 can have one or more locking devices, such as locking device 126. The locking device 126 can be a quarter turn cam latch, a quarter turn compression latch, other latches or fasteners, or the like.

The second support flange 106 is depicted having the second attachment holes 110 formed through it.

The third support leg 32 and the second support leg 30 can be connected to a first channel member 630a. And the third support leg 32 and the first support leg 28 can be connected to a second channel member 630b. The channel members 630a and 630b can be configured to provide support to the base plate 14.

The first support flange 104 can also be seen protruding away from the first support leg 28, and with the first attachment holes 108.

A plurality of fasteners 118 are depicted securing the enclosure 38 to the base 12. For example, a first fastener 496c can be disposed through the first segment and the base 12, and a second fastener 496a can be disposed through the second segment and the base 12.

Figure 5:
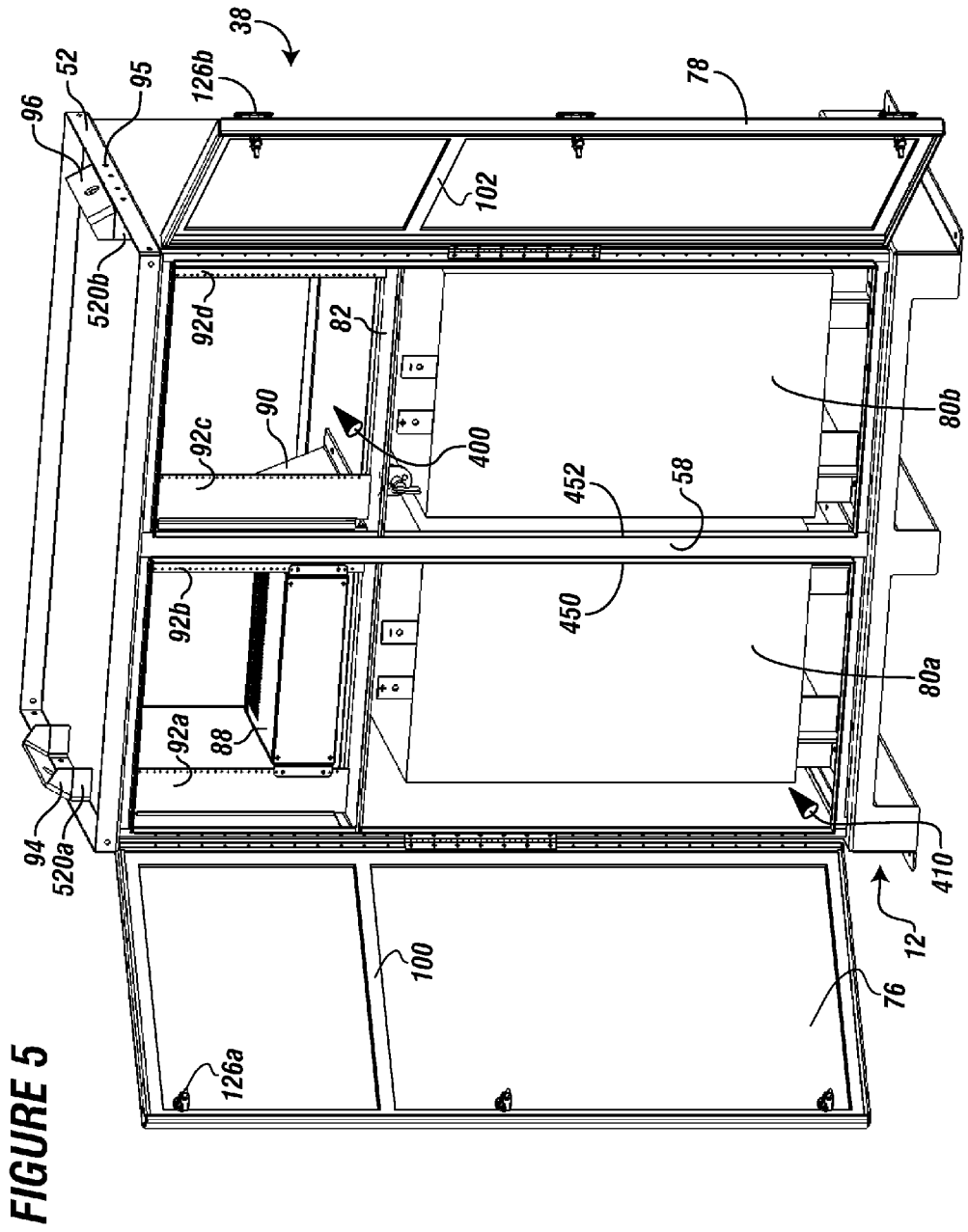
FIG. 5 depicts an isometric view of an illustrative transportable weatherproof battery power supply and storage for electronic equipment in an assembled configuration.

FIG. 5 depicts an isometric view of an illustrative transportable weatherproof enclosure for electronic equipment and telecom batteries in an assembled configuration.

The transportable weatherproof enclosure for electronic equipment and telecom batteries can include the second lifting eye 96, the top flange 52, one or more top flange through holes 95 formed through the top flange, the second door gasket 102, the second door 78, a first locking device 126a disposed on the first door 76; a second locking device 126b disposed on the second door 78, the base 12, a second opening flange gasket 452, a first opening flange gasket 450, a second enclosure portion 410, the bulkhead 82 and bulkhead support member 90, the first door gasket 100, electronic equipment 88, a first enclosure portion 400, the first lifting eye 94, and one or more rails, four are shown in this FIG. 92a, 92b, 92c, 92d.

The first locking device 126a can be disposed on the first door 76 and latch to a portion of the front vertical member 58. The second locking device 126b can be disposed on the second door 78 and can latch to a portion of the front vertical member 58.

The first lifting eye 94 can be connected to the enclosure 38 by a first lifting eye gusset 520a, and the second lifting eye 96 can be connected to the enclosure 38 with a second lifting eye gusset 520b.

The second opening flange gasket 452 and the first opening flange gasket 450 can be disposed on the front vertical member 58, for example, on the first vertical member flange, depicted in FIGS. 2 and 3, and the second vertical member flange, depicted in FIGS. 2 and 3. The opening flange gaskets 452 and 450 can be used in conjunction with or in lieu of the second door gasket 102 and the first door gasket 100.

The bulkhead 82 can divide the inner portion of the enclosure 38 into the second enclosure portion 410 and the first enclosure portion 400. The first enclosure portion 400 can be configured to have one or more battery packs 80a and 80b stored therein.

The second enclosure portion 410 can be configured to store the electronic equipment 88. For example, electronic equipment 88 can be stored between a first rail 92a and a second rail 92b. In addition, the electronic equipment 88 can be secured to the rails 92a and 92b. Additional electronic equipment (not depicted) can be disposed between and secured to a third rail 92c and a fourth rail 92d.

The transportable weatherproof enclosure for electronic equipment and telecom batteries can be assembled at a factory by placing the battery packs 80a and 80b on the base 12 and securing the enclosure 38 to the base 12. For example, by placing fasteners through one or more of the flanges described herein.

Figure 6:
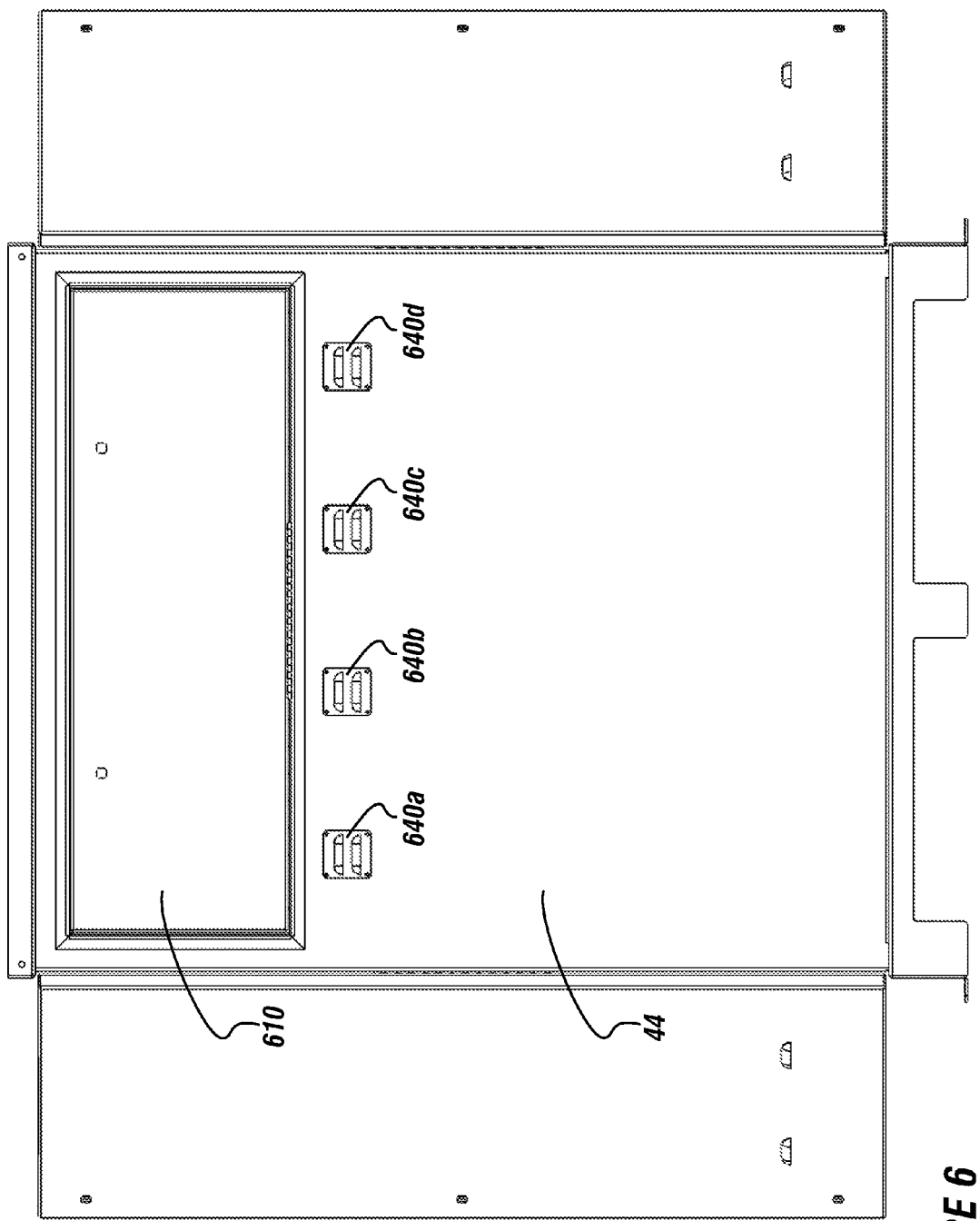
FIG. 6 depicts a back view of the illustrative transportable weatherproof battery power supply and storage for electronic equipment of FIG. 1.

FIG. 6 depicts a back view of the illustrative transportable weatherproof enclosure for electronic equipment and telecom batteries of FIG. 5.

The back wall 44 can have a plurality of vents 640a, 640b, 640c, 640d formed therein. In addition an access door 610 can be disposed on the back wall 44. The access door 610 can be used to insert and remove electronic equipment from the first enclosure portion.

FIG. 7 depicts an illustrative transportable weatherproof battery power supply and storage for electronic equipment with the electronic equipment 88 in communication with one or more of the battery packs 80a and 80b.

A switch 640 can be disposed between the electronic equipment 88 and the battery packs 80a and 80b. The switch 640 can be used to control the flow of electricity from one or more of the battery packs 80a and 80b to the electronic equipment 88. The switch can be an on/off switch that is configured to isolate the batteries from other components.

A monitor 652 can be connected to the battery packs 80a and 80b. The monitor 652 can be configured to monitor and display information about one or more of the battery packs 80a and 80b. The monitor 652 can be digital or analog.

At least one fuse can be in electrical communication with the electronic equipment 88 and one or more battery pack 80a and 80b. In this Figure, two fuses are shown 660a, 660b.

While these embodiments have been described with emphasis on the embodiments, it should be understood that within the scope of the appended claims, the embodiments might be practiced other than as specifically described herein.

What is claimed is:

1. A transportable weatherproof battery power supply and storage for electronic equipment comprising:
   a. a base comprising:
      (i) a base plate, wherein the base plate has a top surface, a bottom surface, a first end, a front end, a second end, and a back end;
      (ii) a first support leg connected to the bottom surface of the base plate and extending along the first end of the base plate;
      (iii) a second support leg connected to the bottom surface of the base plate and extending along the second end of the base plate;
      (iv) a third support leg connected to the bottom surface, wherein the third support leg is disposed between the first support leg and the second support leg, and wherein the third support leg extends parallel to the first support leg;
      (v) a first prong receiving channel disposed between the first support leg and the third support leg; and
      (vi) a second prong receiving channel disposed between the second support leg and the third support leg;
   b. an enclosure removably engaged to the base plate comprising:
      (i) a first wall;
      (ii) a back wall connected to the first wall;
      (iii) a second wall connected to the back wall;
      (iv) a top, wherein the top has a top plate and a top flange, wherein the top flange extends from the top plate, wherein the top flange is disposed around a perimeter of the top plate, wherein the top is connected to the first wall, the second wall, and the back wall, and wherein the first wall, the back wall, the second wall, and the top form an enclosure interior;
      (v) at least one pair of lifting eyes comprising:
         a. a first lifting eye, wherein the first lifting eye is connected to the top flange and centered over the first wall;
         b. a second lifting eye, wherein the second lifting eye is connected to the top flange and centered over the second wall, and wherein the second lifting eye is axially aligned with the first lifting eye; and
         c. the at least one pair of lifting eyes configured to allow lifting of the enclosure by a crane, and wherein either the first prong receiving channel or the second prong receiving channel is configured to receive a lifting prong to allow lifting of the enclosure by a mechanical device;
      (vi) a front vertical member connected to the at least a portion of the top plate;

(vii) a bottom member connected to the front vertical member, the first wall, and the second wall;
(viii) a bottom opening disposed between the first wall and the second wall and between the back wall and the bottom member;
(ix) a first wall flange connected to the first wall, and a second wall flange connected to the second wall;
(x) a first vertical member flange connected to a first portion of the front vertical member; and
(xi) a second vertical member flange connected to a second portion of the front vertical member;
c. a first door pivotably connected to the first wall, wherein the first door is configured to engage the front vertical member, first vertical member flange, or both;
d. a second door pivotably connected to the second wall, wherein the second door is configured to engage the front vertical member, the second vertical member flange, or both; and
e. a first battery pack disposed within the enclosure, wherein the first battery pack is secured to the base plate.

2. The transportable weatherproof battery power supply and storage for electronic equipment of claim 1, further comprising a second battery pack disposed within the enclosure interior and in electrical communication with the first battery pack, wherein the first battery pack is connected in parallel or in series to the second battery pack.

3. The transportable weatherproof battery power supply and storage for electronic equipment of claim 1, further comprising a switch in electrical communication with the first battery pack, a monitor in electrical communication with first battery pack, or combinations thereof.

4. The transportable weatherproof battery power supply and storage for electronic equipment of claim 1, further comprising electronic equipment disposed within the enclosure interior, wherein the electrical equipment is in electrical communication with the first battery pack.

5. The transportable weatherproof battery power supply and storage for electronic equipment of claim 4, further comprising a fuse in electrical communication between the electronic equipment and the first battery pack.

6. The transportable weatherproof battery power supply and storage for electronic equipment of claim 4, wherein the electronic equipment is a gas chromatograph, a flow meter, a recharging terminal for hand held electronic devices, or combinations thereof.

7. The transportable weatherproof battery power supply and storage for electronic equipment of claim 1, further comprising a bulkhead connected to the first wall, the second wall, the back wall, and the front vertical member, forming a first enclosure portion between the bulkhead and the top, and a second enclosure portion between the bulkhead and the first wall flange, the second wall flange, a bottom member flange, a back wall flange, or combinations thereof.

8. The transportable weatherproof battery power supply and storage for electronic equipment of claim 7, wherein the first enclosure portion is configured to receive and support electronic equipment, and wherein the second enclosure portion is configured to receive and support a plurality of battery packs.

9. The transportable weatherproof battery power supply and storage for electronic equipment of claim 8, wherein the plurality of battery packs are fastened to the base plate.

10. The transportable weatherproof battery power supply and storage for electronic equipment of claim 7, further comprising a bulkhead support member connected to the front vertical member and to the bulkhead.

11. The transportable weatherproof battery power supply and storage for electronic equipment of claim 7, further comprising at least one rail disposed within the first enclosure portion and connected to the bulkhead and to the top.

12. The transportable weatherproof battery power supply and storage for electronic equipment of claim 1, wherein the top flange comprises a top flange through hole.

13. The transportable weatherproof battery power supply and storage for electronic equipment of claim 1, wherein the first door comprises a first door flange configured to engage the first vertical member flange, and wherein the second door comprises a second door flange configured to engage the second vertical member flange.

14. The transportable weatherproof battery power supply and storage for electronic equipment of claim 13, further comprising a first door gasket disposed about the first door flange, and a second door gasket disposed about the second door flange, wherein the first door gasket is configured to sealably engage the first vertical member flange, and wherein the second door gasket is configured to sealably engage the second vertical member flange.

15. The transportable weatherproof battery power supply and storage for electronic equipment of claim 1, wherein the first support leg further comprises a first support flange extending perpendicular to the first wall, and wherein the second support leg further comprises a second support flange extending perpendicular to the second wall.

16. The transportable weatherproof battery power supply and storage for electronic equipment of claim 15, wherein the first support flange comprises at least one first attachment hole for engaging a surface, and wherein the second support flange comprises at least one second attachment hole for engaging the surface.

17. The transportable weatherproof battery power supply and storage for electronic equipment of claim 1, further comprising a plurality of front attachment holes disposed through the bottom member.

18. The transportable weatherproof battery power supply and storage for electronic equipment of claim 1, further comprising a first opening flange gasket disposed about the first vertical member flange and a second opening flange gasket disposed about the second vertical member flange, wherein the first opening flange gasket is configured to sealably engage the first door, and wherein the second opening flange gasket is configured to sealably engage the second door.

19. The transportable weatherproof battery power supply and storage for electronic equipment of claim 1, further comprising at least one locking device disposed on each door, wherein each locking device is configured to engage the front vertical member, the first vertical member flange, the second vertical member flange, or combinations thereof.

20. The transportable weatherproof battery power supply and storage for electronic equipment of claim 1, wherein the base further comprises a channel member connected to the bottom surface of the base plate between the base plate and each of the support legs, wherein the channel member extends from the first wall to the second wall.

* * * * *